(12) United States Patent
Khalaf et al.

(10) Patent No.: US 11,621,685 B2
(45) Date of Patent: Apr. 4, 2023

(54) DIGITALLY CONTROLLED VARIABLE GAIN AMPLIFIER

(71) Applicant: IMEC vzw, Leuven (BE)

(72) Inventors: Khaled Khalaf, Aarschot (BE); Steven Brebels, Heverlee (BE)

(73) Assignee: IMEC vzw, Leuven (BE)

( * ) Notice: Subject to any disclaimer, the term of this patent is extended or adjusted under 35 U.S.C. 154(b) by 89 days.

(21) Appl. No.: 17/095,658

(22) Filed: Nov. 11, 2020

(65) Prior Publication Data
US 2021/0143784 A1    May 13, 2021

(30) Foreign Application Priority Data

Nov. 12, 2019  (EP) ..................... 19208628

(51) Int. Cl.
| | |
|---|---|
| *H03G 3/00* | (2006.01) |
| *H03F 1/56* | (2006.01) |
| *H03F 3/72* | (2006.01) |
| *H03G 1/00* | (2006.01) |

(52) U.S. Cl.
CPC .............. *H03G 3/001* (2013.01); *H03F 1/56* (2013.01); *H03F 3/72* (2013.01); *H03G 1/0088* (2013.01)

(58) Field of Classification Search
CPC ........ H03G 3/001; H03G 1/0088; H03F 1/56; H03F 3/72; H03F 2203/7236
USPC .............................. 330/279, 254, 295, 124 R
See application file for complete search history.

(56) References Cited

U.S. PATENT DOCUMENTS 5,903,191 A    5/1999  Gosser

FOREIGN PATENT DOCUMENTS

WO    WO 2007/105282 A1    9/2007

OTHER PUBLICATIONS

Extended European Search Report dated May 13, 2020 in EP Application No. EP 19208628.8.

*Primary Examiner* — Hafizur Rahman
*Assistant Examiner* — Khiem D Nguyen
(74) *Attorney, Agent, or Firm* — Knobbe, Martens, Olson & Bear, LLP

(57) ABSTRACT

A digitally controlled variable gain amplifier (VGA) for generating amplification output levels is disclosed. In one aspect, the digitally controlled VGA includes a positive amplification stage including at least two positive amplifiers, and a corresponding negative amplification stage coupled to the positive amplification stage. The negative amplification stage includes at least two negative amplifiers. The positive amplification stage and the corresponding negative amplification stage are digitally controlled by one or more digital codes. The corresponding negative amplification stage is coupled in parallel with the positive amplification stage and is equally weighted as the positive amplification stage, and both the positive amplification stage and the corresponding negative amplification stage selectively contribute to the generation of the amplification output levels for the digitally controlled VGA.

16 Claims, 9 Drawing Sheets

| Main input code (21,22) | Negative input code (23,24) | Positive auxiliary code (241) | Negative auxiliary code (242) | Output level (10) |
|---|---|---|---|---|
| 00 | 11 | 0 | 1 | -4 |
| 00 | 11 | 0 | 0 | -3 |
| 00 | 11 | 1 | 0 | -2 |
| 01 | 10 | 0 | 1 | -2 |
| 01 | 10 | 0 | 0 | -1 |
| 01 | 10 | 1 | 0 | 0 |
| 10 | 01 | 0 | 1 | 0 |
| 10 | 01 | 0 | 0 | 1 |
| 10 | 01 | 1 | 0 | 2 |
| 11 | 00 | 0 | 1 | 2 |
| 11 | 00 | 0 | 0 | 3 |
| 11 | 00 | 1 | 0 | 4 |

Fig. 4

DIGITALLY CONTROLLED VARIABLE GAIN AMPLIFIER

CROSS-REFERENCE TO RELATED APPLICATIONS

This application claims foreign priority to European Application No. 19208628.8, filed Nov. 12, 2019, the content of which is incorporated by reference herein in its entirety.

BACKGROUND

Technological Field

The disclosed technology generally relates to impedance equalization for linear high resolution digitally controlled circuits. Particularly, the disclosed technology relates to a digitally controlled variable gain amplifier for linear high resolution digitally controlled circuits.

Description of the Related Technology

A variable gain amplifier, also referred to as a voltage-controlled amplifier (VGA), is an electronic amplifier that varies its gain depending on a control voltage. Variable gain amplifiers play an important role nowadays in maximizing a dynamic range of, for example, wireless communications systems. A digitally controlled amplifier is a variable gain amplifier that is digitally controlled and can be used in digitally controlled circuits. Digitally controlled circuits, for example, comprise variable gain amplifiers, RF-Digital-to-Analog Converters, also referred to as RF-DAC's, active shifters, and so forth.

A digitally controlled variable gain amplifier, or digitally controlled VGA, uses a stepped approach giving the digitally controlled circuit gradual increments of gain selection. With digitally controlled variable gain amplifiers, a binary code or digital word applied to a digital port or register controls the gain. To achieve discrete amplification, several amplifiers can be stacked together, thereby building a digitally variable gain amplifier with discrete gain steps controlled by digital signals also referred to as digital code. For example, as depicted in FIG. 1A, a digitally controlled variable gain amplifier 14 comprises a first amplifier 11 of weight 1 coupled in parallel to a second amplifier 12 of weight 2 and a digital code 140 which specifies the amount of gain that the digitally controlled VGA should output. The digital code 140 comprises two bits and the digital code 140 selects which of the first amplifier 11 and/or the second amplifier 12 is on. The digitally controlled VGA of FIG. 1A must amplify the analogue input 13 labelled "IN" and thereby generates amplification output levels 130 labelled "OUT". With the digitally controlled variable gain amplifier 14 of FIG. 1A, an amplification output level of 2 can be obtained when the first amplifier 11 is off and when the second amplifier 12 is on. Also, with the digitally controlled variable gain amplifier 14 on of FIG. 1A, an amplification output level of 1 can be obtained when the first amplifier 11 is on and when the second amplifier 12 is off. Also, with the digitally controlled variable gain amplifier 14 of FIG. 1A, an amplification output level of 3 can be obtained when both the first amplifier 11 and the second amplifier 12 are on.

Ideally, the input impedance and the output impedance of a digitally controlled VGA are infinite. The voltage gain, which is proportional to the current gain and, therefore, to the weight of the digitally controlled VGA, is consequently linear versus the digital code. However, the digitally controlled VGA generally has a finite input impedance and a finite output impedance. The finite impedances are functions of the weight of the digitally controlled VGA, and the finite impedances further lead to non-linearity in the voltage gain equation of the digitally controlled VGA. In other words, the voltage gain of the digitally controlled VGA becomes non-linear versus digital code. This causes Integral Non-Linearity errors, also referred to as INL errors.

The best way to make a digitally controlled VGA linear versus digital code is to keep its input impedance and its output impedance independent from the digital code, in other words, fixed with respect to the digital code. Several impedance equalization techniques are known from prior art.

For example, variable passive components, such as, for example, resistors and/or capacitors, can be added at the input and/or at the output of the digitally controlled VGA to equalize the input impedance and/or the output impedance of the digitally controlled VGA versus the digital code.

A drawback of this approach is that the addition of passive components add extra losses in the digitally controlled circuit. Additionally, this approach is also often not well matched to the parasitics of the variable active components.

Another impedance equalization technique comprises adding dummy active components to a digitally controlled VGA. As shown in FIG. 1B, a digitally controlled VGA 15 comprises a first amplifier 11 of weight 1 in parallel with a second amplifier 12 of weight 2. A digital code 140 is used to select which of the first amplifier 11 and/or the second amplifier 12 is on. The digital code 140 comprises two control bits 141; 142. A first dummy amplifier 16 of weight 1 is coupled in parallel with a second dummy amplifier 17 of weight 2. Both the first dummy amplifier 16 and the second dummy amplifier 17 are coupled to the first amplifier 11 and the second amplifier 12 such that all the amplifiers of the digitally controlled VGA 15 share the same analog input signal 13 labelled "IN" to be amplified. Additionally, the first dummy amplifier 16 and the second dummy amplifier 17 are coupled to the first amplifier 11 and the second amplifier 12 via an inverter for the digital code 140. In other words, the control bits 143; 144 controlling respectively the first dummy amplifier 16 and the second dummy amplifier 17 are inverted with respect to the control bits 141; 142 controlling respectively the first amplifier 11 and the second amplifier 12. Additionally, the first dummy amplifier 16 and the second dummy amplifier 17 are terminated with an AC ground 18. FIGS. 1C to 1F illustrate how the digitally controlled VGA 15 of FIG. 1B functions. For a digital code 140 equal to 3, for example, when the first control bit 141 of the digital code 140 is equal to 1 and the first control bit 141 controls the first amplifier 11 of weight 1 and when the second control bit 142 of the digital code 140 is equal to 1 and the second control bit 142 controls the second amplifier 12 of weight 2, as depicted in FIG. 1C, both the first amplifier 11 and the second amplifier 12 are on and both the first dummy amplifier 16 and the second dummy amplifier 17 are off. In the case of FIG. 1C, a total weight of three amplifiers are on and a total weight of three amplifiers are off. When the digital code 140 changes, for example, as illustrated in FIGS. 1D, 1E and 1F, where at least one of the control bits 141; 142 of the digital code 140 is equal to 0, one or more of the first amplifier 11 and the second amplifier 12 become off and at least one of the control bits 143; 144 is equal to 1, resulting in either the corresponding first dummy amplifier 16 and/or the second dummy amplifier 17 being on. For example, in FIG. 1D, the first amplifier 11 with weight 1 is off, while the second amplifier 12 with weight 2 is on. For example, in FIG. 1E, the first amplifier 11 with weight 1 is on, while the second amplifier 12 with weight 2 is off. For example, in FIG. 1F, the first amplifier 11 with weight 1 is off, and the second amplifier 12 with weight 2 is off. In these cases, the first dummy amplifier 16 and/or the second dummy amplifier 17 are on so that the total weight of amplifiers which are on is kept equal to 3 and so that the total weight of amplifiers which are off is also kept equal to 3 regardless of the digital code 140. If the amplifiers are unilateral, i.e. if the input and the output networks of the amplifiers are isolated, then the input impedance is kept the same for all the digital codes 140.

Adding dummy active components 16; 17 to a digitally controlled VGA however often equalizes only the input impedance or the output impedance. Also, if the digitally controlled VGA is bilateral, for example due to the existence of gate-drain capacitance or Cgd, then the different output impedances seen by the first amplifier 11, the second amplifier 12 and the dummy amplifiers 16; 17 will affect the flatness of the input impedance versus digital code 140. In other words, if the digitally controlled VGA is bilateral, a non-symmetric output impedance will cause a non-equalized input impedance versus digital code. Finally, adding dummy amplifiers to the digitally controlled VGA can significantly increase the footprint of the circuit. This is a major drawback for cost-sensitive applications including phased array chips with multiple front-ends where the front-end dominates the chip footprint and therefore the cost.

The above-mentioned solutions for resolving the impedance variation versus digital code of a digitally controlled VGA still suffer from shortcomings, especially in terms of extra losses, mismatches and residual non-linearity of the voltage gain causing INL errors.

SUMMARY OF CERTAIN INVENTIVE ASPECTS

It is an objective of the disclosed technology to disclose a digitally controlled variable gain amplifier that overcomes the above identified shortcomings of existing solutions. More particularly, it is an objective to disclose a digitally controlled variable gain amplifier (VGA) for which load equalization for both the input and the output of the amplifier is achieved while demonstrating a linear voltage behavior and without having to introduce additional losses or mismatches versus digital code.

The scope of protection sought for the various embodiments of the disclosed technology is set out by the independent claims. The embodiments and features described in this specification that do not fall within the scope of the independent claims, if any, are to be interpreted as examples useful for understanding various embodiments of the disclosed technology.

According to a first aspect of the present disclosure, the above defined objectives are realized by a digitally controlled variable gain amplifier, or digitally controlled VGA, for generating amplification output levels, wherein the digitally controlled VGA comprises: a positive amplification stage comprising at least two positive amplifiers; a corresponding negative amplification stage comprising at least two negative amplifiers; wherein the positive amplification stage and the corresponding negative amplification stage are digitally controlled by one or more digital codes; and wherein: the corresponding negative amplification stage is coupled in parallel with the positive amplification stage; the corresponding negative amplification stage is equally weighted as the positive amplification stage; and both the positive amplification stage and the corresponding negative amplification stage are configured to selectively contribute to the generation of the amplification output levels for the digitally controlled VGA.

A digitally controlled variable gain amplifier, or digitally controlled VGA, according to the disclosed technology achieves discrete gain values. The digitally controlled VGA according to the disclosed technology is therefore a discrete digitally controlled VGA. The digitally controlled VGA according to the disclosed technology comprises a corresponding negative amplification stage which comprises at least two negative amplifiers coupled in parallel with a positive amplification stage comprising at least two positive amplifiers. The digitally controlled VGA according to the disclosed technology therefore does not comprise dummy amplifiers. No additional losses are introduced in a digitally controlled circuit comprising the digitally controlled VGA according to the disclosed technology. The corresponding negative amplification stage of the digitally controlled VGA according to the disclosed technology is not coupled to an AC ground. On the contrary, the corresponding negative amplification stage is coupled in parallel with the positive amplification stage such that both the positive amplification and the corresponding negative amplification stage selectively contribute to the generation of the amplification output levels of the digitally controlled VGA. In other words, the corresponding negative amplification stage shares the same input and the same output as the positive amplification stage of the digitally controlled VGA. The analogue input of the digitally controlled VGA serves as an input for both the positive amplification stage and the corresponding negative amplification stage, and the analogue output of the digitally controlled VGA corresponds to the output of the positive amplification stage combined with the output of the corresponding negative amplification stage. This way, amplification output levels of the digitally controlled VGA are generated from both the positive amplification stage and the corresponding negative amplification stage. For example, the positive amplification stage is configured to generate amplification output levels for the digitally controlled VGA. For example, the corresponding negative amplification stage is configured to generate amplification output levels for the digitally controlled VGA. For example, both the positive amplification stage and the corresponding negative amplification stage are configured to simultaneously generate amplification output levels for the digitally controlled VGA. Additionally, the corresponding negative amplification stage is equally weighted as the corresponding positive amplification stage. In other words, the total amplification weight of the positive amplification stage is equal to the total amplification weight of the corresponding negative amplification stage. Additionally, the corresponding negative amplification stage is digitally controlled via one or more digital codes which for example correspond to the digital code controlling the positive amplification stage which is inverted through an inverter. This way, the total number of amplifiers switched on over the positive amplification stage and the corresponding negative amplification stage is always the same independently from the digital code, and the total number of amplifiers switched off over the positive amplification stage and the corresponding negative amplification stage is always the same regardless the digital code. Every single amplifier of the digitally controlled VGA according to the disclosed technology can be individually switched on or off. This way, load equalization for both the input and the output of the amplifier is achieved. In other words, both the input impedance and the output impedance of the digitally controlled VGA have values that are the same for any digital code. The implementation of the digitally controlled VGA is robust against mismatch variations. A linear voltage gain behavior of the digitally controlled VGA versus code can therefore be achieved thanks to the use of the corresponding negative amplification stage. Ideally, an Integral Non-Linearity close to zero can be achieved with the digitally controlled VGA according to the disclosed technology. Additionally, negative values of amplification output levels can be achieved with the digitally controlled VGA according to the disclosed technology through presence of the corresponding negative amplification stage.

The digitally controlled VGA according to the disclosed technology further demonstrates a more compact design than prior art solutions, for example, than VGA's comprising dummy amplifiers requiring a negative sign such as, for example, active IQ phase shifters. The proposed digitally controlled VGA demonstrates a minimized footprint and uses at most the space needed for the positive amplification stage and the corresponding negative amplification stage. This also comes with less capacitive load which allows more bandwidth and lower matching losses when matching to high impedance devices, such as for example common-source amplifiers, using inductive components. Additionally, the digitally controlled VGA according to the disclosed technology also opens the door to the use of higher resolution amplifiers and phase shifters, especially when interfaced with inductive components. The resolution of an amplifier is determined by the maximum total amplifier size, for the maximum digital code size, and the minimum LSB size, where LSB is the last position in the digital stream size. The total size of the digitally controlled VGA according to the present disclosed technology is limited by impedance matching losses and minimum target bandwidth that are also degraded with the addition of capacitive parasitics.

According to an optional aspect of the disclosure, the digital codes comprise one or more control bits, wherein the one or more control bits are configured to control one or more of the positive amplifiers of the positive amplification stage and/or one or more of the negative amplifiers of the corresponding negative amplification stage.

For example, at least one digital code comprises one control bit which is configured to control the positive amplification stage and the corresponding negative amplification stage. Alternatively, at least one digital code comprises a plurality of control bits, for example, one control bit per positive amplifier of the system and/or one control bit per negative amplifier of the system.

According to an optional aspect of the disclosure, the digital codes comprise one or more control bits, and the positive amplification stage is controlled by the one or more control bits.

In other words, the one or more control bits are configured to control the positive amplification stage.

According to an optional aspect of the disclosure, the corresponding negative amplification stage is coupled in parallel to the positive amplification stage through an inverter circuit, wherein the inverted circuit is configured to invert the one or more control bits, thereby generating inverted control bits; and the corresponding negative amplification stage is controlled by the inverted control bits.

In other words, the one or more inverted control bits are configured to control the corresponding negative amplification stage. The inverter placed on the digital code towards the negative amplification stage ensures that the number or weight of amplifiers that are on is always the same as the number or weight of amplifiers that are off regardless of the digital code. The use of an inverter minimizes the number of control bits necessary to digitally control the positive amplifiers and the negative amplifiers. Indeed, only two control bits are used to digitally control the positive amplification stage and the inverter generates two inverted control bits to digitally control the corresponding negative amplification stage. Alternatively, the corresponding negative amplification stage is directly coupled to the positive amplification stage and the digital code comprises four or more control bits. In this alternative embodiment, each of the positive amplifiers of the positive amplification stage is controlled by one of the control bits of the digital code and each of the negative amplifiers of the corresponding negative amplification stage is controlled by one of the control bits of the digital code.

According to an optional aspect of the disclosure, each of the positive amplifiers of the positive amplification stage is controlled by one of the control bits; and wherein each of the negative amplifiers of the corresponding negative amplification stage is controlled by one of the inverted control bits such that a positive amplifier and a negative amplifier of the same weight are controlled respectively by a control bit and a corresponding inverted control bit.

The corresponding inverted control bit is generated by the inverter circuit when inverting the corresponding control bit. This way, when a positive amplifier with a positive weight of the positive amplification stage is switched on, the corresponding negative amplifier of the corresponding negative amplification stage with the same given weight as the positive amplifier is switched off. Alternatively, when a positive amplifier with a positive weight of the positive amplification stage is switched off, the corresponding negative amplifier of the corresponding negative amplification stage with the same given weight as the positive amplifier is switched on. In other words, to each positive amplifier corresponds a negative amplifier which is configured to work in an opposite state with respect to the positive amplifier.

This way, corresponding negative amplifiers can be on so that the total weight of amplifiers which are on is kept the same as the total weight of amplifiers which are off regardless of the digital code. As opposed to dummy amplifiers, the negative amplifiers of the corresponding negative amplification stage share the same input network and the same output network as the positive amplifiers of the positive amplification stage. Additionally, the positive amplifiers and the negative amplifiers are digitally controlled through the digital code. Therefore, both the input impedance and the output impedance of the digitally controlled VGA are equalized versus the digital code regardless of whether the amplifiers are unilateral or bilateral.

For example, when the positive amplification stage comprises two positive amplifiers, a first positive amplifier of the two positive amplifiers is controlled by one of said the control bits and a second positive amplifier of the two positive amplifiers is controlled by another bit of the two control bits. Also, when the corresponding negative amplification stage comprises two negative amplifiers, a first negative amplifier of the two negative amplifiers is controlled by one of the two inverted control bits and a second negative amplifier of the two negative amplifiers is controlled by another bit of the two inverted control bits.

According to an optional aspect of the disclosure, the digitally controlled VGA further comprises an auxiliary amplification stage coupled in parallel to the positive amplification and to the corresponding negative amplification stage; and wherein: the auxiliary amplification stage comprises a positive auxiliary amplifier and/or a negative auxiliary amplifier; and the auxiliary amplification stage further contributes to the generation of the amplification output levels for the digitally controlled VGA.

The auxiliary amplification stage comprises one or more unit auxiliary amplifiers. With the digitally controlled VGA according to the disclosed technology comprising a positive amplification stage and a negative amplification stage, only odd amplification output levels can be achieved. For example, amplification output levels '0' and '2' are missing. One or more unit auxiliary amplifiers, for example, auxiliary amplifiers with a weight of 1, can be added to the digitally controlled VGA. Preferably, a positive auxiliary amplifier and/or a negative auxiliary amplifier are added to the digitally controlled VGA. The positive auxiliary amplifier and/or a negative auxiliary amplifier share the same analogue input and the same analogue output as the positive amplification stage and the corresponding negative amplification stage of the digitally controlled VGA. In other words, amplification output levels of the digitally controlled VGA are generated from the positive amplification stage and from the corresponding negative amplification stage and from the positive auxiliary amplifier and/or the negative auxiliary amplifier. The positive auxiliary amplifier and/or the negative auxiliary amplifier are implemented to achieve even amplification output levels, for example '0' and '2'. One unit auxiliary amplifier for example contributes to the even positive amplification output levels of the digitally controlled VGA and one unit auxiliary amplifier for example contributes to the even negative amplification output levels of the digitally controlled VGA. In other words, with the positive auxiliary amplifier and the negative auxiliary amplifier, all odd amplification output levels can be generated. In order to also implement even amplification output levels, only one bit is necessary to move from an amplification output level of 1 to 2 or from amplification output level of 3 to 2. These unit auxiliary amplifiers disturb the load equalization process by 1 LSB since in the worst case either of them will be on at a time to generate the even amplification output levels. In other words, the benefit of the disturbance by only 1 LSB works when a positive auxiliary amplifier and a negative auxiliary amplifier are used. This 1 LSB error can be ignored in high resolution digitally controlled circuits.

According to an optional aspect of the disclosure, the auxiliary amplification stage comprises at least two auxiliary amplifiers, wherein the at least two auxiliary amplifiers comprise a positive auxiliary amplifier and a negative auxiliary amplifier.

According to an optional aspect of the disclosure, the positive auxiliary amplifier is digitally controlled by one or more first auxiliary digital codes and the negative auxiliary amplifier is digitally controlled by one or more second auxiliary digital codes.

The second auxiliary digital codes are different from the first auxiliary digital codes. Alternatively, the positive auxiliary amplifier is digitally controlled by one or more first auxiliary digital codes and the negative auxiliary amplifier is coupled to the positive auxiliary amplifier via an inverter configured to invert the first auxiliary digital codes, thereby generating inverted auxiliary digital codes corresponding to the second auxiliary digital codes. In this alternative embodiment, the negative auxiliary amplifier is then digitally controlled by the inverted auxiliary digital codes.

According to an optional aspect of the disclosure, a weight of the positive auxiliary amplifier or of the negative auxiliary amplifier is equal to the weight of the amplifier of the positive amplification stage or of the corresponding negative amplification stage with the lowest weight.

At least the positive auxiliary amplifier and/or the negative auxiliary amplifier has a weight which is equal to the weight of an amplifier of the positive amplification stage and the negative amplification stage with the lowest weight of all the amplifiers of the positive amplification stage and the negative amplification stage. In other words, the positive auxiliary amplifier and/or the negative auxiliary amplifier must have the same weight as the lowest amplifier of the positive amplification stage and/or the negative amplification stage. This way, thanks to the use of an auxiliary amplifier with the lowest weight, the resolution of the digitally controlled VGA is fine enough to maximize the number of amplification output levels which can be achieved by the digitally controlled VGA.

According to a second aspect of the present disclosure, there is provided a method for forming a digitally controlled variable gain amplifier, or digitally controlled VGA, for generating amplification output levels, wherein said method comprises the steps of: providing a positive amplification stage comprising at least two positive amplifiers; providing a corresponding negative amplification stage comprising at least two negative amplifiers; coupling the corresponding negative amplification stage in parallel with the positive amplification stage; weighing the corresponding negative amplification stage equally as the positive amplification stage; controlling the positive amplification stage and the corresponding negative amplification stage by one or more digital codes; and allowing both the positive amplification stage and the corresponding negative amplification stage to selectively contribute to the generation of amplification output levels, thereby forming the digitally controlled VGA.

A digitally controlled variable gain amplifier, or digitally controlled VGA, according to the disclosed technology, may achieve discrete gain values. The digitally controlled VGA according to the disclosed technology comprises a corresponding negative amplification stage which comprises at least two negative amplifiers coupled in parallel with a positive amplification stage comprising at least two positive amplifiers. The digitally controlled VGA according to the disclosed technology therefore does not comprise instead of dummy amplifiers. No additional losses are introduced in a digitally controlled circuit with the method according to the disclosed technology. Also, mismatches due to additional equalizing circuitry is not present due to the symmetry of the positive and negative amplification stages. The corresponding negative amplification stage of the digitally controlled VGA according to the disclosed technology is not coupled to an AC ground. On the contrary, with the method according to the disclosed technology, the corresponding negative amplification stage is coupled in parallel with the positive amplification stage. In other words, the corresponding negative amplification stage shares the same input and the same output as the positive amplification stage of the digitally controlled VGA. The analogue input of the digitally controlled VGA serves as an input for both the positive amplification stage and the corresponding negative amplification stage, and the analogue output of the digitally controlled VGA corresponds to the output of the positive amplification stage combined with the output of the corresponding negative amplification stage. This way, amplification output levels of the digitally controlled VGA are generated with the method according to the disclosed technology from both the positive amplification stage and the corresponding negative amplification stage. Additionally, the corresponding negative amplification stage is equally weighted as the corresponding positive amplification stage. In other words, the total amplification weight of the positive amplification stage is equal to the total amplification weight of the corresponding negative amplification stage. Additionally, the corresponding negative amplification stage is digitally controlled via a digital code which corresponds to the digital code controlling the positive amplification stage which was inverted through an inverter. This way, the total number of amplifiers switched on over the positive amplification stage and the corresponding negative amplification stage is always the same independently from the digital code, and the total number of amplifiers switched off over the positive amplification stage and the corresponding negative amplification stage is always the same regardless the digital code. This way, load equalization for both the input and the output of the amplifier is achieved. In other words, both the input impedance and the output impedance of the digitally controlled VGA have values that are the same for any digital code. A linear voltage gain behavior of the digitally controlled VGA versus code can therefore be achieved thanks to the use of the corresponding negative amplification stage. Ideally, an Integral Non-Linearity close to zero can be achieved with the digitally controlled VGA formed with the method according to the disclosed technology. Additionally, negative values of amplification output levels can be achieved with the digitally controlled VGA obtained from the method according to the disclosed technology through presence of the corresponding negative amplification stage.

BRIEF DESCRIPTION OF THE DRAWINGS

FIG. 4 schematically illustrates a truth table of the amplification output levels for the digitally controlled variable gain amplifier of FIG. 3, wherein the digitally controlled variable gain amplifier further comprises unit auxiliary amplifiers.

DETAILED DESCRIPTION OF CERTAIN ILLUSTRATIVE EMBODIMENTS

Figure 1A:
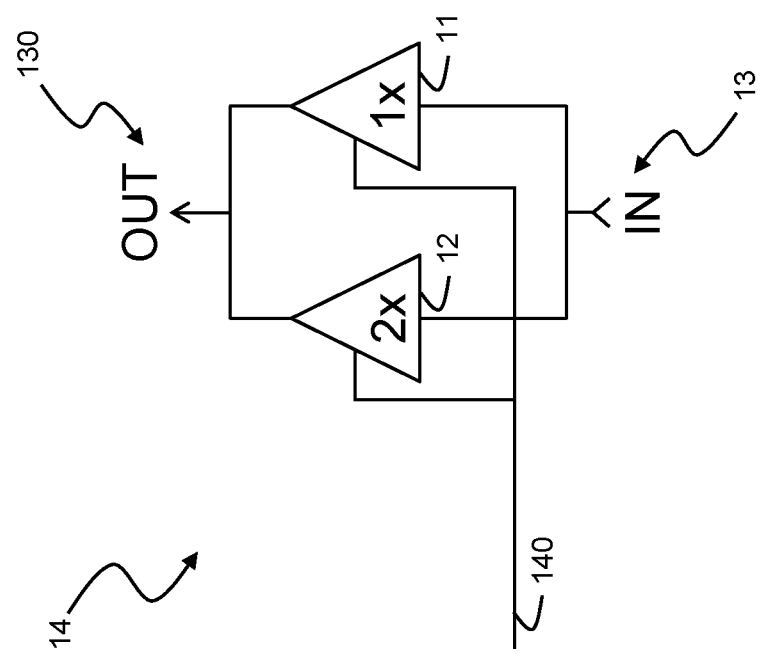
FIG. 1A schematically illustrates an example of a 2-bit binary-weighted digitally controlled variable gain amplifier known from prior art.

According to an embodiment known from prior art and shown in FIG. 1A, a 2-bit binary-weighted example of a digitally controlled variable gain amplifier 14 is schematically represented. The digitally controlled variable gain amplifier 14 comprises a first amplifier 11 of weight 1 is coupled in parallel to a second amplifier 12 of weight 2 and a digital code 140 which specifies the amount of gain that the digitally controlled VGA should output. The digital code 140 comprises two bits and the digital code 140 selects which of the first amplifier 11 and/or of the second amplifier 12 is on. The digitally controlled VGA of FIG. 1A must amplify the analogue input 13 labelled "IN" and thereby generate amplification output levels 130 labelled "OUT". With the digitally controlled variable gain amplifier 14 on FIG. 1A, an amplification output level of 2 can be obtained when the first amplifier 11 is off and when the second amplifier 12 is on. Also, with the digitally controlled variable gain amplifier 14 on FIG. 1A, an amplification output level of 1 can be obtained when the first amplifier 11 is on and when the second amplifier 12 is off. Also, with the digitally controlled variable gain amplifier 14 on FIG. 1A, an amplification output level of 3 can be obtained when both the first amplifier 11 and the second amplifier 12 are on.

Figure 1B:
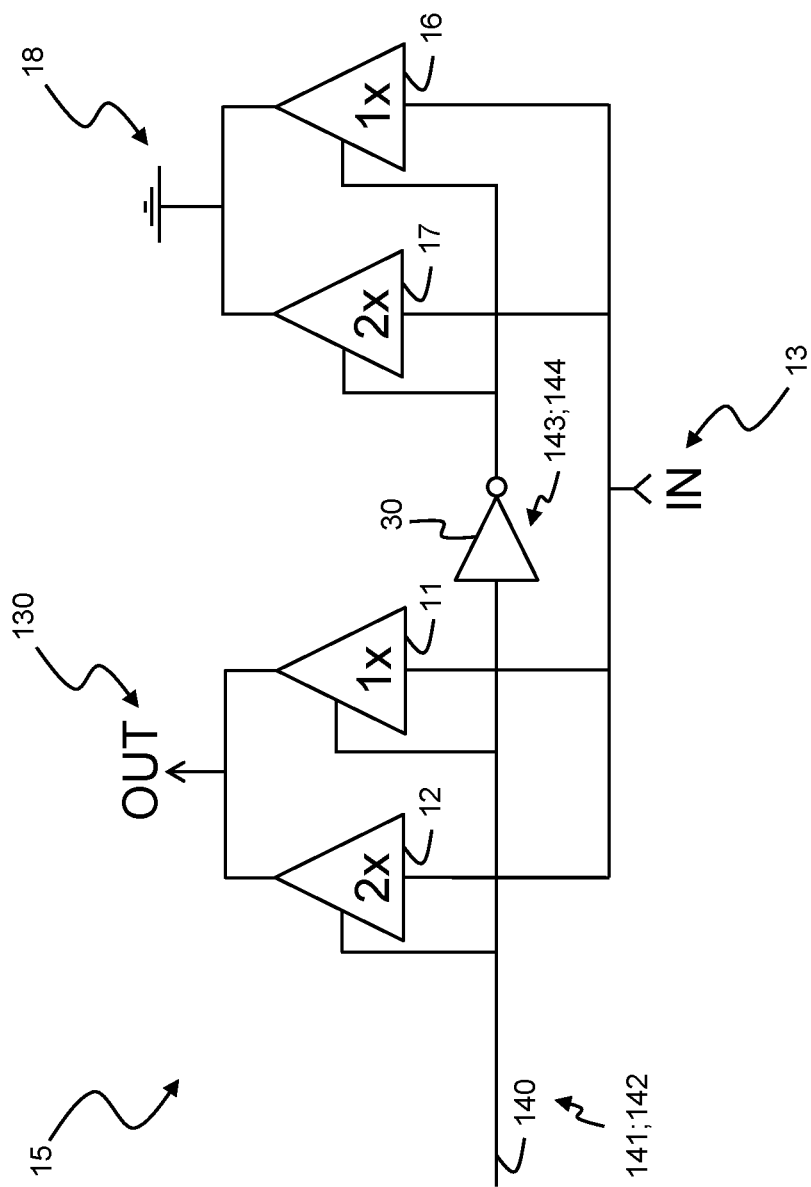
FIG. 1B schematically illustrates an example of a digitally controlled variable gain amplifier known from prior art and comprising dummy devices.
Figure 1C:
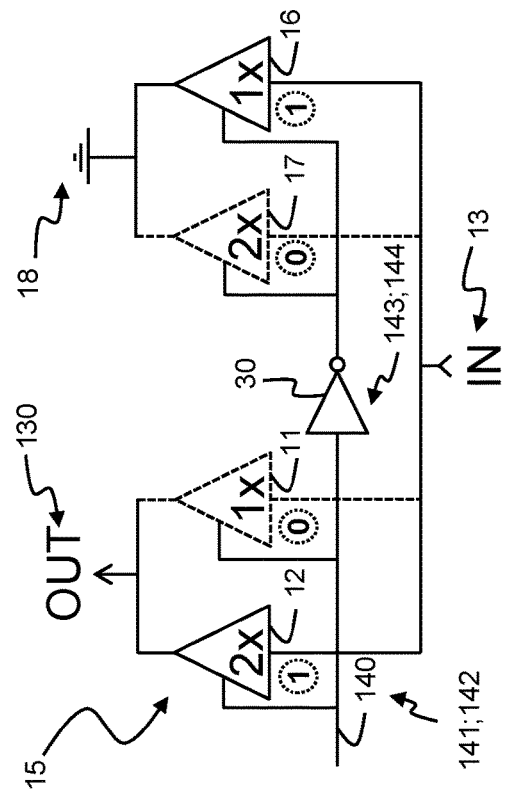
FIG. 1C, FIG. 1D, FIG. 1E, and FIG. 1F demonstrate the behavior of the digitally controlled variable gain amplifier of FIG. 1B known from prior art and comprising dummy devices.
Figure 1D:
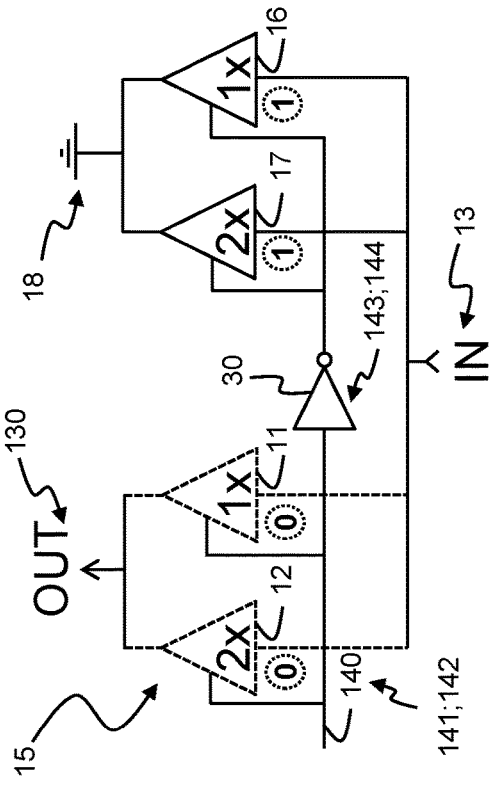
Figure 1E:
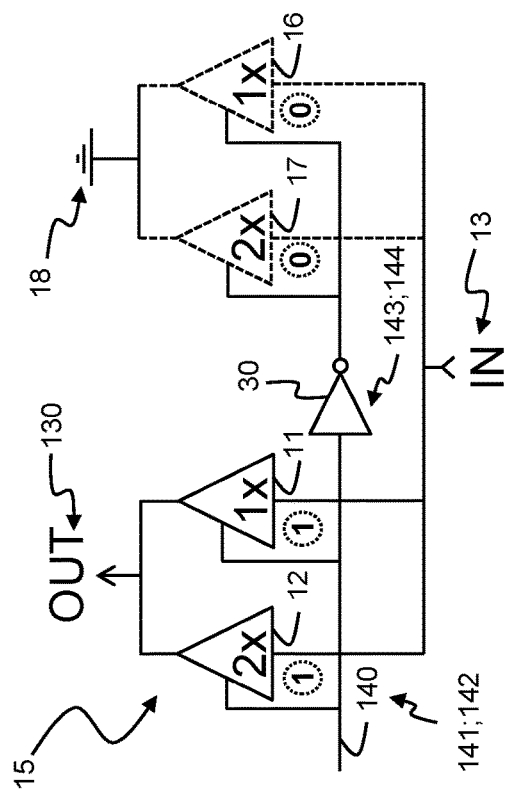
Figure 1F:
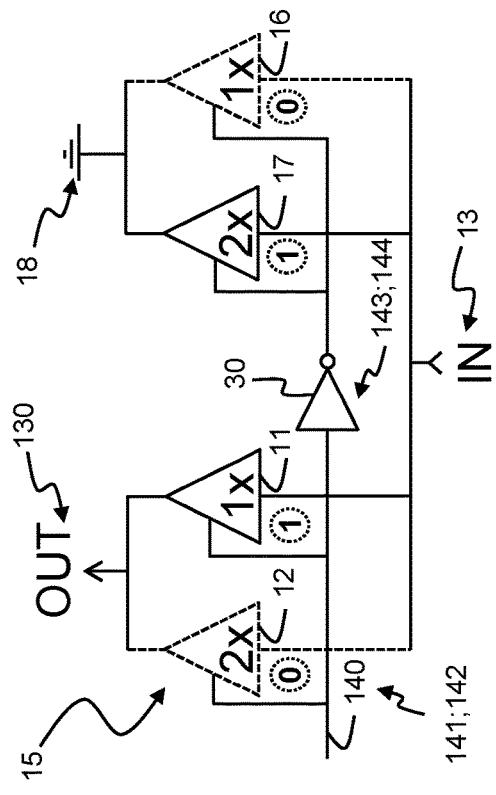

According to an embodiment known from prior art and shown in FIG. 1B, a digitally controlled variable gain amplifier 15 comprises a first amplifier 11 of weight 1 in parallel with a second amplifier 12 of weight 2. A digital code 140 is used to select which of the first amplifier 11 and/or the second amplifier 12 is on. The digital code 140 comprises two control bits 141; 142. A first dummy amplifier 16 of weight 1 is coupled in parallel with a second dummy amplifier 17 of weight 2. Both the first dummy amplifier 16 and the second dummy amplifier 17 are coupled to the first amplifier 11 and the second amplifier 12 such that all the amplifiers of the digitally controlled VGA 15 share the same analog input signal 13 labelled "IN" to be amplified. Additionally, the first dummy amplifier 16 and the second dummy amplifier 17 are coupled to the first amplifier 11 and the second amplifier 12 via an inverter for the digital code 140. In other words, the control bits 143; 144 controlling respectively the first dummy amplifier 16 and the second dummy amplifier 17 are inverted with respect to the control bits 141; 142 controlling respectively the first amplifier 11 and the second amplifier 12. Additionally, the first dummy amplifier 16 and the second dummy amplifier 17 are terminated with an AC ground 18. FIG. 1C to 1F illustrate how the digitally controlled VGA 15 of FIG. 1B functions. For a digital code 140 equal to '3', i.e. when the first control bit 141 of the digital code 140 is equal to 1 and the first control bit 141 controls the first amplifier 11 of weight 1 and when the second control bit 142 of the digital code 140 is equal to '1' and the second control bit 142 controls the second amplifier 12 of weight 2, as depicted in FIG. 1C, both the first amplifier 11 and the second amplifier 12 are on and both the first dummy amplifier 16 and the second dummy amplifier 17 are off. In the case of FIG. 1C, a total weight of three amplifiers are on and a total weight of three amplifiers are off. When the digital code 140 changes, for example as illustrated in FIGS. 1D, 1E and 1F where at least one of the control bits 141; 142 of the digital code 140 is equal to 0, one or more of the first amplifier 11 and the second amplifier 12 become off and at least one of the control bits 143; 144 is equal to 1, resulting in either the first dummy amplifier 16 and/or the second dummy amplifier 17 being on. For example, in FIG. 1D, when the digital code 140 is '2', the first amplifier 11 with weight 1 is off, while the second amplifier 12 with weight 2 is on. For example, in FIG. 1E, when the digital code 140 is '1'. the first amplifier 11 with weight 1 is on, while the second amplifier 12 with weight 2 is off. For example, in FIG. 1F, when the digital code 140 is '0', the first amplifier 11 with weight 1 is off, and the second amplifier 12 with weight 2 is off. In these cases, the first dummy amplifier 16 and/or the second dummy amplifier 17 are on so that the total weight of amplifiers which are on is kept equal to 3 and so that the total weight of amplifiers which are off is also kept equal to 3 regardless of the digital code 140. If the amplifiers are unilateral, for example, if the input and the output networks of the amplifiers are isolated, then the input impedance is kept the same for all the digital codes 140.

Figure 2A:
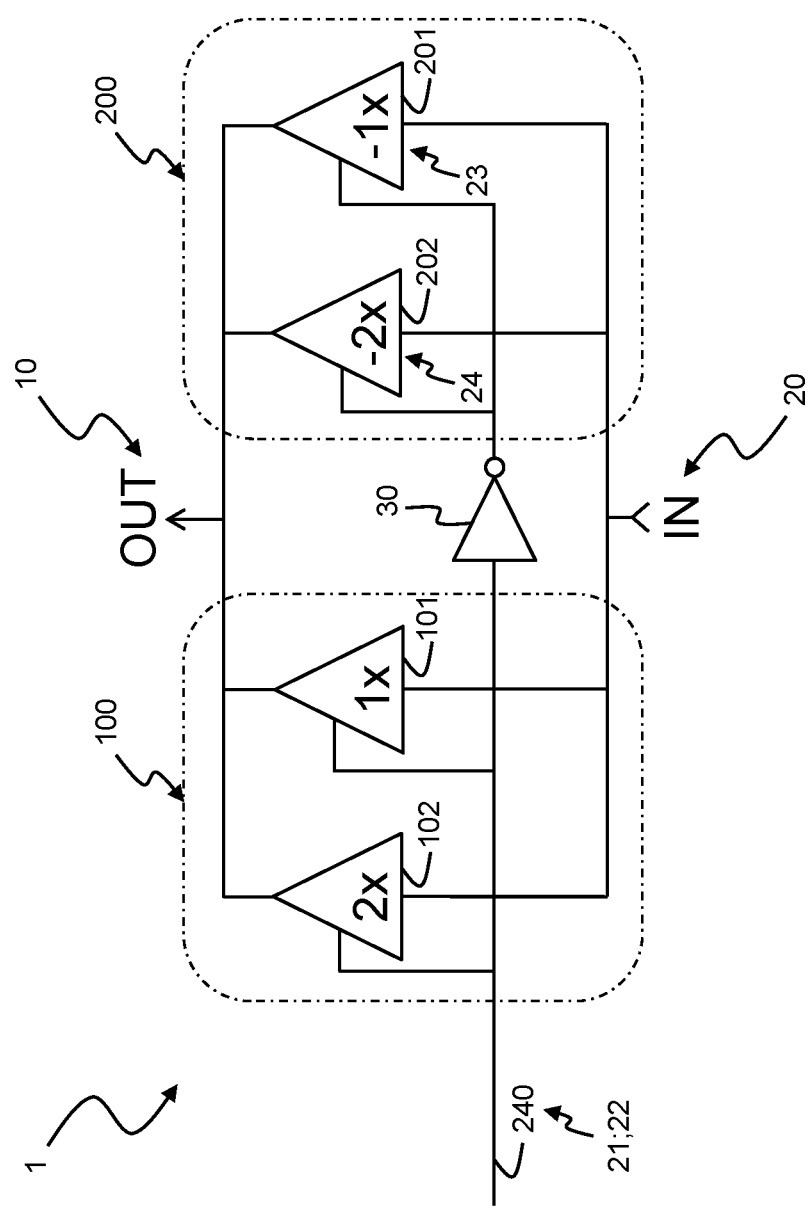
FIG. 2A schematically illustrates an embodiment of a digitally controlled variable gain amplifier according to the disclosed technology.

According to an embodiment shown in FIG. 2A, a digitally controlled variable gain amplifier 1, or digitally controlled VGA 1, comprises a positive amplification stage 100 and a corresponding negative amplification stage 200. The positive amplification stage 100 and the corresponding negative amplification stage 200 are digitally controlled by one or more digital codes 240, for example one digital code 240 as depicted on FIG. 2A. The digital codes 240 comprise one or more control bits 21; 22. For example, the digital code 240 of FIG. 2A comprises two control bits 21; 22. According to an alternative embodiment, the digital code 240 of FIG. 2A comprises four control bits 21; 22; 23; 24. According to a further alternative embodiment, the digital code 240 of FIG. 2A comprises one control bit. The positive amplification stage 100 comprises two positive amplifiers 101; 102, more precisely one positive amplifier 101 of weight 1 and one positive amplifier 102 of weight 2. The corresponding negative amplification stage 200 comprises two negative amplifiers 201; 202, more precisely one negative amplifier 201 of weight 1 and one negative amplifier 202 of weight 2. The corresponding negative amplification stage 200 is therefore equally weighted as the positive amplification stage 100. In other words, the total weight of the corresponding negative amplification stage 200 is equal to the total weight of the positive amplification stage 100. The corresponding negative amplification stage 200 is coupled in parallel with the positive amplification stage 100. The corresponding negative amplification stage 200 is therefore coupled to the same analogue input 20 and the same analogue output as the positive amplification stage 100. The corresponding negative amplification stage 200 contributes to the generation of the amplification output levels 10 of the digitally controlled VGA 1. Amplification output levels 10 of the digitally controlled VGA 1 are therefore generated from both the positive amplification stage 100 and the corresponding negative amplification stage 200. The positive amplification stage 100 is controlled by two or more control bits 21; 22. In other words, the first positive amplifier 101 is digitally controlled by the control bit 21 and the second positive amplifier 102 is digitally controlled by the control bit 22. The corresponding negative amplification stage 200 is coupled to the positive amplification stage 100 through an inverter circuit 30 configured to invert the two or more bits 21; 22, thereby generating inverted control bits 23; 24. The corresponding negative amplification stage 200 is controlled by the inverted control bits 23; 24. The first negative amplifier 201 is digitally controlled by the inverted control bit 23 and the second negative amplifier 202 is digitally controlled by the inverted control bit 24. In other words, each of the positive amplifiers 101; 102 of the positive amplification stage 100 is controlled by one of the control bits 21; 22 and each of the negative amplifiers 201; 202 of the corresponding negative amplification stage 200 is controlled by one of the inverted control bits 23; 24.

Figure 2B:
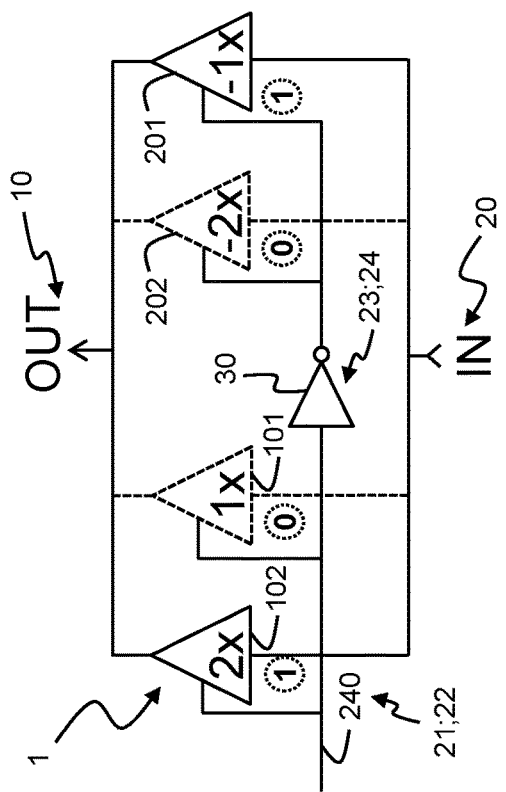
FIGS. 2B, 2C, 2D, 2E schematically illustrate demonstrate an embodiment of the behavior of the digitally controlled variable gain amplifier of FIG. 2A according to the disclosed technology.
Figure 2C:
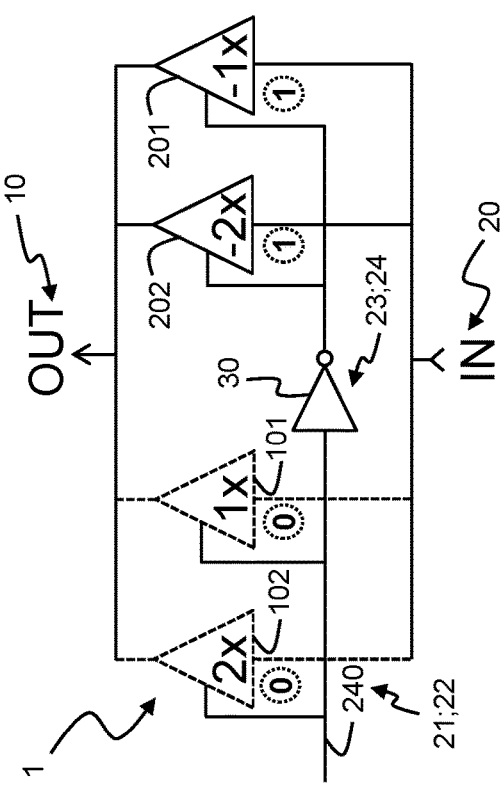
Figure 2D:
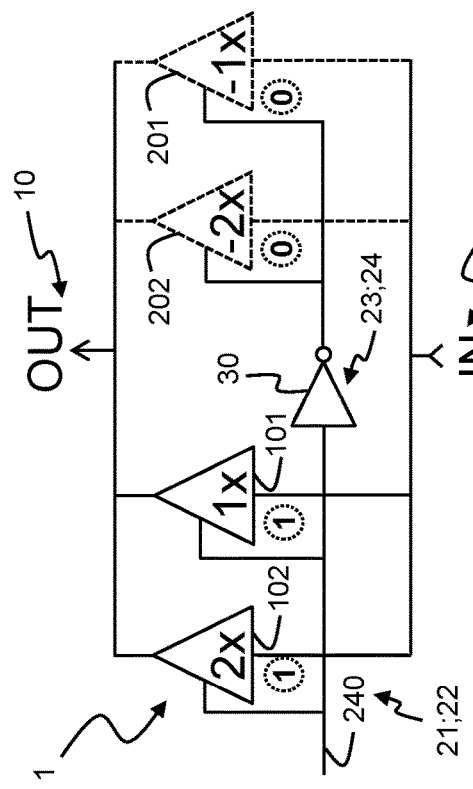
Figure 2E:
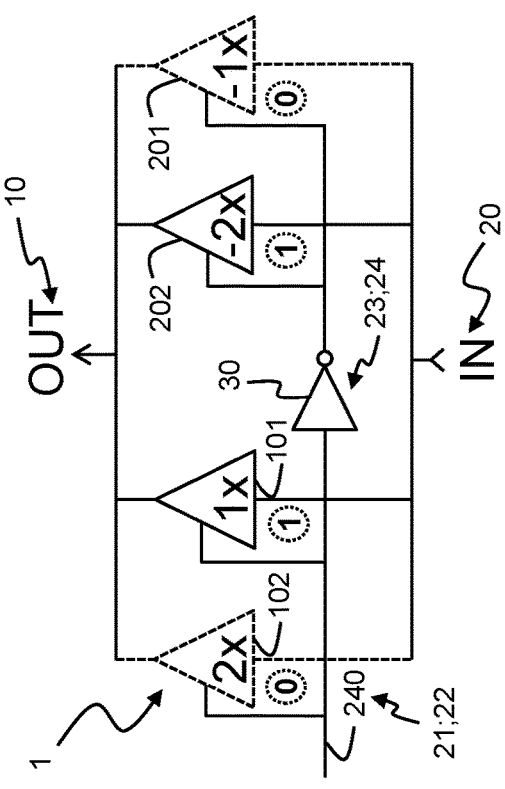

FIG. 2B to 2E illustrate how the digitally controlled VGA 1 of FIG. 2A functions. Components having similar reference numbers than on FIG. 2A fulfill the same function. Each of the digitally controlled VGA's 1 of FIGS. 2B to 2E comprises a positive amplification stage 100 and a corresponding negative amplification stage 200. The positive amplification stage 100 and the corresponding negative amplification stage 200 are digitally controlled by one or more digital codes 240, for example one digital code 240 in FIG. 2B to 2E. The digital code 240 of FIG. 2B to 2E comprises two control bits 21; 22. The positive amplification stage 100 comprises two positive amplifiers 101; 102, more precisely one positive amplifier 101 of weight 1 and one positive amplifier 102 of weight 2. The corresponding negative amplification stage 200 comprises two negative amplifiers 201; 202, more precisely one negative amplifier 201 of weight 1 and one negative amplifier 202 of weight 2. The corresponding negative amplification stage 200 is therefore equally weighted as the positive amplification stage 100. In other words, the total weight of the corresponding negative amplification stage 200 is equal to the total weight of the positive amplification stage 100. The corresponding negative amplification stage 200 is coupled in parallel with the positive amplification stage 100. The corresponding negative amplification stage 200 is therefore coupled to the same analogue input 20 and the same analogue output as the positive amplification stage 100. The corresponding negative amplification stage 200 contributes to the generation of the amplification output levels 10 of the digitally controlled VGA 1. Amplification output levels 10 of the digitally controlled VGA 1 are therefore generated from both the positive amplification stage 100 and the corresponding negative amplification stage 200. The positive amplification stage 100 is controlled by two or more control bits 21; 22. In other words, the first positive amplifier 101 is digitally controlled by the control bit 21 and the second positive amplifier 102 is digitally controlled by the control bit 22. The corresponding negative amplification stage 200 is coupled to the positive amplification stage 100 through an inverter circuit 30 configured to invert the two or more bits 21; 22, thereby generating inverted control bits 23; 24. The corresponding negative amplification stage 200 is controlled by the inverted control bits 23; 24. The first negative amplifier 201 is digitally controlled by the inverted control bit 23 and the second negative amplifier 202 is digitally controlled by the inverted control bit 24. In other words, each of the positive amplifiers 101; 102 of the positive amplification stage 100 is controlled by one of the control bits 21; 22 and each of the negative amplifiers 201; 202 of the corresponding negative amplification stage 200 is controlled by one of the inverted control bits 23; 24. For a digital code equal to '3', as depicted in FIG. 2B, i.e. for a control bit 21 equal to 1 and a control bit 22 equal to 1, resulting in the inverted control bit 23 being equal to 0 and the inverted control bit 24 being equal to 0, both the first positive amplifier 101 and the second positive amplifier 102 are on and both the first negative amplifier 201 and the second negative amplifier 202 are off, thereby achieving an amplification output level 10 of +3. In the case of FIG. 2B, a total weight of three amplifiers are on and a total weight of three amplifiers are off. When the digital code changes, for example as illustrated in FIGS. 2C, 2D and 2E, one or more of the first positive amplifier 101 and the second positive amplifier 102 become off. For example, in FIG. 2C, when the digital code is '2', i.e. for a control bit 21 equal to 0 and a control bit 22 equal to 1, resulting in the inverted control bit for the first negative amplifier 201 being equal to 1 and the inverted control bit for the second negative amplifier 202 being equal to 0, the first positive amplifier 101 with weight 1 is off, while the second positive amplifier 102 with weight 2 is on while the first negative amplifier 201 with weight 1 is on and the second negative amplifier 202 with weight 2 is off, thereby achieving an amplification output level of +2. For example, in FIG. 2D, when the digital code is '−1', i.e. for a control bit 21 equal to 1 and a control bit 22 equal to 0, resulting in the inverted control bit for the first negative amplifier 201 being equal to 0 and the inverted control bit for the second negative amplifier 202 being equal to 1, the first positive amplifier 101 with weight 1 is on, while the second positive amplifier 102 with weight 2 is off and while the first negative amplifier 201 with weight 1 is off and the second negative amplifier 202 with weight 2 is on, thereby achieving an amplification output level of −1. For example, in FIG. 2E, when the digital code is '−3', i.e. for a control bit 21 equal to 0 and a control bit 22 equal to 0, resulting in the inverted control bit for the first negative amplifier 201 being equal to 1 and the inverted control bit for the second negative amplifier 202 being equal to 1, both the first positive amplifier 101 with weight 1 and the second positive amplifier 102 with weight 2 are off, while both the first negative amplifier 201 with weight 1 and the second negative amplifier 202 with weight 2 are on, thereby achieving an amplification output level of −3.

Figure 3:
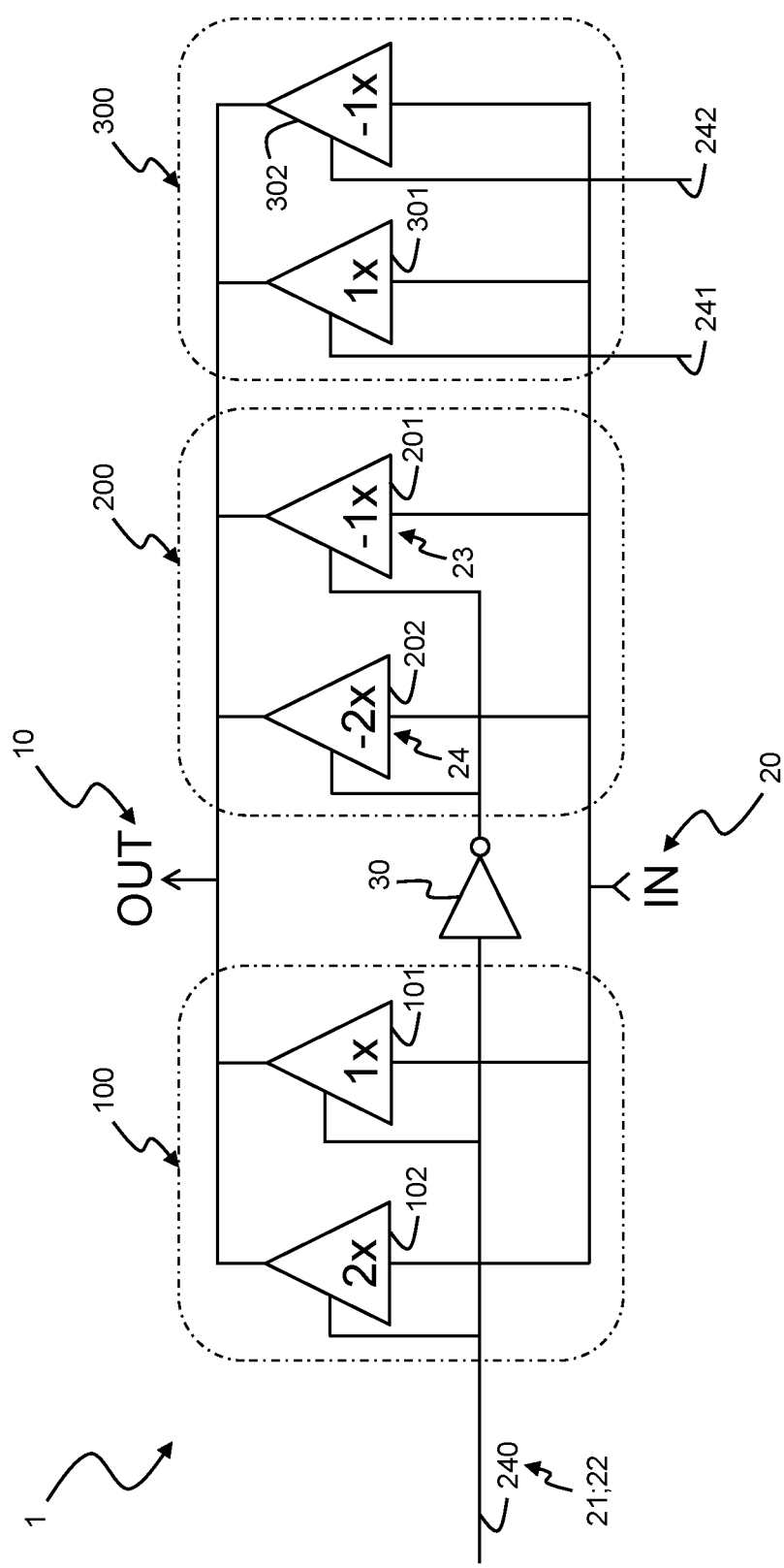
FIG. 3 schematically illustrates an embodiment of a digitally controlled variable gain amplifier according to the disclosed technology, wherein the digitally controlled variable gain amplifier further comprises unit auxiliary amplifiers.

According to an embodiment shown in FIG. 3, a digitally controlled variable gain amplifier 1, or digitally controlled VGA 1, comprises a positive amplification stage 100 and a corresponding negative amplification stage 200. Components having similar reference numbers than on FIGS. 2A to 2E fulfill the same function. The positive amplification stage 100 and the corresponding negative amplification stage 200 are digitally controlled by a digital code 240. The digital code 240 comprises two control bits 21; 22. The positive amplification stage 100 comprises two positive amplifiers 101; 102, more precisely one positive amplifier 101 of weight 1 and one positive amplifier 102 of weight 2. The corresponding negative amplification stage 200 comprises two negative amplifiers 201; 202, more precisely one negative amplifier 201 of weight 1 and one negative amplifier 202 of weight 2. The corresponding negative amplification stage 200 is therefore equally weighted as the positive amplification stage 100. In other words, the total weight of the corresponding negative amplification stage 200 is equal to the total weight of the positive amplification stage 100. The corresponding negative amplification stage 200 is coupled in parallel with the positive amplification stage 100. The corresponding negative amplification stage 200 is therefore coupled to the same analogue input 20 and the same analogue output as the positive amplification stage 100. The corresponding negative amplification stage 200 contributes to the generation of the amplification output levels 10 of the digitally controlled VGA 1. Amplification output levels 10 of the digitally controlled VGA 1 are therefore generated from both the positive amplification stage 100 and the corresponding negative amplification stage 200. The positive amplification stage 100 is controlled by two or more control bits 21; 22. In other words, the first positive amplifier 101 is digitally controlled by the control bit 21 and the second positive amplifier 102 is digitally controlled by the control bit 22. The corresponding negative amplification stage 200 is coupled to the positive amplification stage 100 through an inverter circuit 30 configured to invert the two or more bits 21; 22, thereby generating inverted control bits 23; 24. The corresponding negative amplification stage 200 is controlled by the inverted control bits 23; 24. The first negative amplifier 201 is digitally controlled by the inverted control bit 23 and the second negative amplifier 202 is digitally controlled by the inverted control bit 24. In other words, each of the positive amplifiers 101; 102 of the positive amplification stage 100 is controlled by one of the control bits 21; 22 and each of the negative amplifiers 201; 202 of the corresponding negative amplification stage 200 is controlled by one of the inverted control bits 23; 24. The digitally controlled VGA 1 further comprises an auxiliary amplification stage 300. The auxiliary amplification stage 300 comprises two unit auxiliary amplifiers 301; 302, for example, auxiliary amplifiers with a weight of 1, which are added to the digitally controlled VGA 1 such that both unit auxiliary amplifiers 301; 302 are coupled in parallel with the positive amplification stage 100 and the corresponding negative amplification stage 200, thereby sharing the same input 20 and the same output as the positive amplification stage 100 and the corresponding negative amplification stage 200 of the digitally controlled VGA 1. In other words, amplification output levels 10 of the digitally controlled VGA 1 are generated from the positive amplification stage 100 and the corresponding negative amplification stage 200 and the auxiliary amplification stage 300. The positive auxiliary amplifier 301 is digitally controlled by a first auxiliary digital code 241 comprising for example one first auxiliary control bit. The negative auxiliary amplifier 302 is digitally controlled by a second auxiliary digital code 242 comprising for example one second auxiliary control bit. The second auxiliary digital code 242 is for example different from the first auxiliary digital code 241. The two unit auxiliary amplifiers 301; 302 are implemented to achieve even amplification output levels 10, for example '0' and '2'. One unit auxiliary amplifier 301, for example, contributes to the even positive amplification output levels 10 of the digitally controlled VGA 1 and one unit auxiliary amplifier 302 for example contributes to the even negative amplification output levels 10 of the digitally controlled VGA 1.

According to an embodiment shown in FIG. 4, a truth table of the proposed load equalization technique for the digitally controlled VGA of FIG. 3 is presented. Components having similar reference numbers than on FIGS. 2A to 2E fulfill the same function. The digitally controlled VGA of FIG. 3 comprises a positive amplification stage, a corresponding negative amplification stage and an auxiliary amplification stage comprising one unit auxiliary amplifier with weight 1 and one unit auxiliary amplifier with weight −1. The positive amplification stage of the digitally controlled VGA of FIG. 3 is controlled by the control bits 21; 22 and the corresponding negative amplification stage is controlled by the inverted control bits 23; 24 corresponding to the bits 21; 22 inverted. In other words, one positive amplifier of the positive amplification stage of the digitally controlled VGA of FIG. 3 is controlled by the control bit 21 and the other positive amplifier of the positive amplification stage of the digitally controlled VGA of FIG. 3 is controlled by the control bit 22. One negative amplifier of the corresponding negative amplification stage of the digitally controlled VGA of FIG. 3 is controlled by the inverted control bit 23. The other negative amplifier of the corresponding negative amplification stage of the digitally controlled VGA of FIG. 3 is controlled by the inverted control bit 24. The auxiliary amplification stage is controlled such that the unit auxiliary amplifier with weight 1 is controlled by the first auxiliary digital code 241 and such that the unit auxiliary amplifier with weight −1 is controlled by the second auxiliary digital code 242. The truth table of FIG. 4 shows the amplification output levels 10 which can be achieved with the digitally controlled VGA of FIG. 3, comprising even and off amplification output levels 10 and ranging from −4 to +4. The truth table of FIG. 4 is shown for a 2-bit example only for simplicity. According to an alternative embodiment, the technique may also be implemented for high resolution circuits. Without an auxiliary amplifier, all odd numbers can be created as amplification output levels 10. As visible on FIG. 4, only one auxiliary amplifier, either a positive auxiliary amplifier or a negative auxiliary amplifier, is enough to implement all even numbers as amplification output levels 10. For example, if the positive auxiliary amplifier only is used, amplification output levels 10 equal from '−3' to '4' can all be implemented. There will only be one missing amplification output level 10, which is '−4'. To achieve the missing amplification output level 10 equal to '−4', the negative auxiliary amplifier must be coupled in parallel with the structure, as depicted on FIG. 3.

Figure 5:
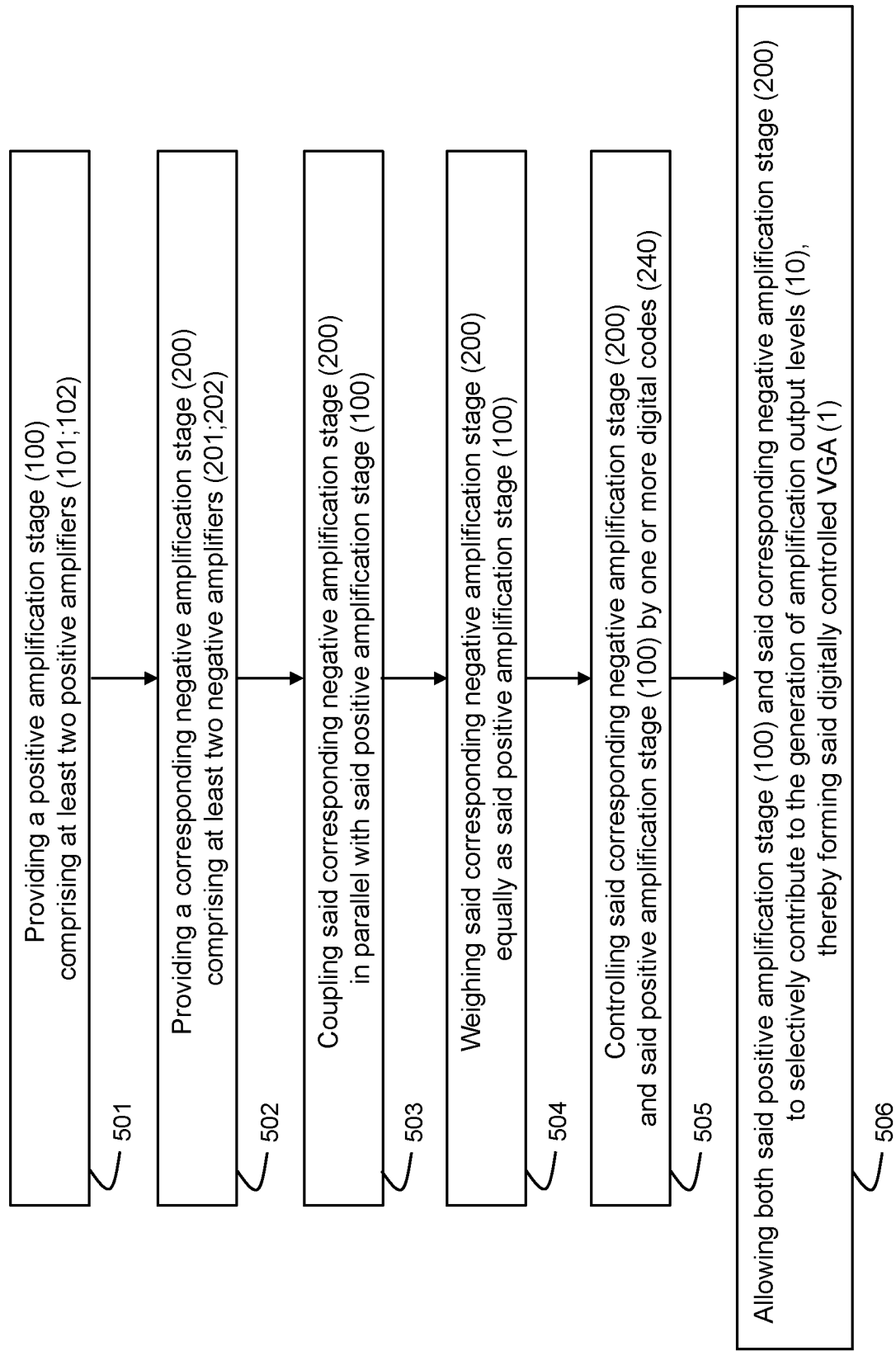
FIG. 5 schematically illustrates an embodiment of the steps of a method according to the disclosed technology.

According to an embodiment of the method steps shown in FIG. 5, the method for forming a digitally controlled variable gain amplifier 1 or digitally controlled VGA 1 for generating amplification output levels 10 is provided. The method comprises a first step 501 in which a positive amplification stage 100 comprising at least two positive amplifiers 101; 102 is provided. In a second step 502, a corresponding negative amplification stage 200 comprising at least two negative amplifiers 201; 202 is provided. The method further comprises the step 503 of coupling the corresponding negative amplification stage 200 in parallel with the positive amplification stage 100 so that the corresponding negative amplification stage 200 shares the same input and the same output as the positive amplification stage 100 of the digitally controlled VGA 1. In step 504, the method comprises equally weighing the corresponding negative amplification stage 200 and the positive amplification stage 100. In step 505, the method comprises controlling the positive amplification stage 100 and the corresponding negative amplification stage by one or more digital codes 240. Finally, the method comprises the step 506 of allowing both the positive amplification stage 100 and the corresponding negative amplification stage 200 to selectively contribute to the generation of the amplification output levels 10, thereby forming the digitally controlled VGA 1.

Figure 6:
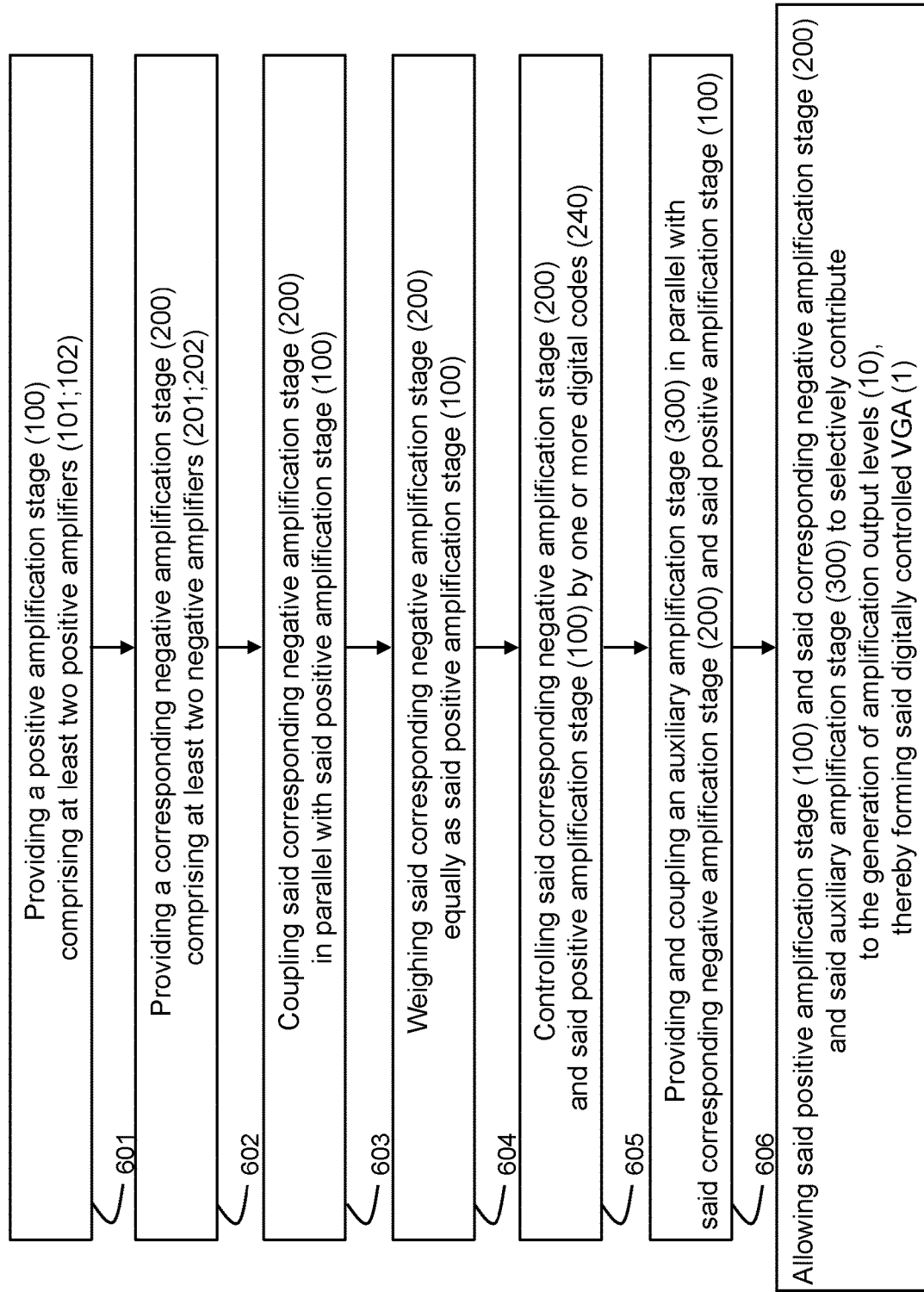
FIG. 6 schematically illustrates an embodiment of the steps of a method comprising providing an auxiliary amplification stage for the digitally controlled variable gain amplifier.

According to an embodiment of the method steps shown in FIG. 6, the method for forming a digitally controlled variable gain amplifier 1 or digitally controlled VGA 1 for generating amplification output levels 10 is provided. The method comprises a first step 601 in which a positive amplification stage 100 comprising at least two positive amplifiers 101; 102 is provided. In a second step 602, a corresponding negative amplification stage 200 comprising at least two negative amplifiers 201; 202 is provided. The method further comprises the step 603 of coupling the corresponding negative amplification stage 200 in parallel with the positive amplification stage 100 so that the corresponding negative amplification stage 200 shares the same input and the same output as the positive amplification stage 100 of the digitally controlled VGA 1. In step 604, the method comprises equally weighing the corresponding negative amplification stage 200 and the positive amplification stage 100. In step 605, the method comprises controlling the positive amplification stage 100 and the corresponding negative amplification stage by one or more digital codes 240. In step 606, the method comprises providing an auxiliary amplification stage 300 and coupling the auxiliary amplification stage 300 in parallel with the positive amplification stage 100 and the corresponding negative amplification stage 200. Finally, the method comprises the step 607 of allowing the positive amplification stage 100 and the corresponding negative amplification stage 200 and the auxiliary amplification stage to selectively contribute to the generation of the amplification output levels 10, thereby forming the digitally controlled VGA 1.

As used in this application, the term "circuitry" may refer to one or more or all of the following: (a) hardware-only circuit implementations such as implementations in only analog and/or digital circuitry and (b) combinations of hardware circuits and software, such as (as applicable): (i) a combination of analog and/or digital hardware circuit(s) with software/firmware and (ii) any portions of hardware processor(s) with software (including digital signal processor(s)), software, and memory(ies) that work together to cause an apparatus, such as a mobile phone or server, to perform various functions) and (c) hardware circuit(s) and/or processor(s), such as microprocessor(s) or a portion of a microprocessor(s), that requires software (e.g. firmware) for operation, but the software may not be present when it is not needed for operation.

This definition of circuitry applies to all uses of this term in this application, including in any claims. As a further example, as used in this application, the term circuitry also covers an implementation of merely a hardware circuit or processor (or multiple processors) or portion of a hardware circuit or processor and its (or their) accompanying software and/or firmware. The term circuitry also covers, for example and if applicable to the particular claim element, a baseband integrated circuit or processor integrated circuit for a mobile device or a similar integrated circuit in a server, a cellular network device, or other computing or network device.

Although the disclosed technology has been illustrated by reference to specific embodiments, it will be apparent to those skilled in the art that the disclosed technology is not limited to the details of the foregoing illustrative embodiments, and that the disclosed technology may be embodied with various changes and modifications without departing from the scope thereof. The present embodiments are therefore to be considered in all respects as illustrative and not restrictive, the scope of the disclosed technology being indicated by the appended claims rather than by the foregoing description, and all changes which come within the scope of the claims are therefore intended to be embraced therein.

It will furthermore be understood by the reader of this patent application that the words "comprising" or "comprise" do not exclude other elements or steps, that the words "a" or "an" do not exclude a plurality, and that a single element, such as a computer system, a processor, or another integrated unit may fulfil the functions of several means recited in the claims. Any reference signs in the claims shall not be construed as limiting the respective claims concerned. The terms "first", "second", third", "a", "b", "c", and the like, when used in the description or in the claims are introduced to distinguish between similar elements or steps and are not necessarily describing a sequential or chronological order. Similarly, the terms "top", "bottom", "over", "under", and the like are introduced for descriptive purposes and not necessarily to denote relative positions. It is to be understood that the terms so used are interchangeable under appropriate circumstances and embodiments of the disclosed technology are capable of operating according to the disclosed technology in other sequences, or in orientations different from the one(s) described or illustrated above.

What is claimed is:

1. A digitally controlled variable gain amplifier (VGA) for generating amplification output levels, the digitally controlled VGA comprising:
   a positive amplification stage comprising at least two positive amplifiers with positive weights;
   a corresponding negative amplification stage comprising at least two negative amplifiers with negative weights, wherein:
      the positive amplification stage and the corresponding negative amplification stage are digitally controlled by one or more digital codes,
      the corresponding negative amplification stage is coupled in parallel to the positive amplification stage, wherein an analog input of the digitally controlled VGA serves as an input for both the positive amplification stage and the corresponding negative amplification stage, and wherein an analog output of the digitally controlled VGA corresponds to an output of the positive amplification stage combined with an output of the corresponding negative amplification stage,
      a total amplification weight of the at least two negative amplifiers of the corresponding negative amplification stage is equal to a total amplification weight of the least two positive amplifiers of the positive amplification stage, and
      both the positive amplification stage and the corresponding negative amplification stage are configured to selectively contribute to the generation of the amplification output levels for the digitally controlled VGA;
   an auxiliary amplification stage coupled in parallel to the positive amplification stage and to the corresponding negative amplification stage, wherein:
      the auxiliary amplification stage shares the analog input and the analog output of the positive amplification stage and the corresponding negative amplification stage,
      the auxiliary amplification stage comprises a positive auxiliary amplifier with a positive weight and controlled by one or more first auxiliary digital codes, and/or a negative auxiliary amplifier with a negative weight and controlled by one or more second auxiliary digital codes, and
      the auxiliary amplification stage further contributes to the generation of the amplification output levels for the digitally controlled VGA.

2. The digitally controlled VGA of claim 1, wherein the one or more digital codes comprise a control bit, and wherein the control bit is configured to control one or more of the at least two positive amplifiers of the positive amplification stage or one or more of the at least two negative amplifiers of the corresponding negative amplification stage.

3. The digitally controlled VGA of claim 1, wherein the one or more digital codes comprise one or more control bits, and wherein the positive amplification stage is controlled by the one or more control bits.

4. The digitally controlled VGA of claim 3, further comprising an inverter circuit placed on the one or more digital codes towards the corresponding negative amplification stage, wherein the inverter circuit is configured to invert the one or more control bits, thereby generating one or more inverted control bits, and wherein the corresponding negative amplification stage is controlled by the one or more inverted control bits.

5. The digitally controlled VGA of claim 4, wherein each of the at least two positive amplifiers of the positive amplification stage is controlled by one of the one or more control bits, and wherein each of the at least two negative amplifiers of the corresponding negative amplification stage is controlled by one of the one or more inverted control bits such that a positive amplifier of the at least two positive amplifiers and a negative amplifier of the at least two negative amplifiers having the same weight are controlled respectively by a control bit of the one or more control bits and a corresponding inverted control bit of the one or more inverted control bits.

6. The digitally controlled VGA of claim 1, wherein the auxiliary amplification stage comprises at least two auxiliary amplifiers, and wherein the at least two auxiliary amplifiers comprise a positive auxiliary amplifier and a negative auxiliary amplifier.

7. The digitally controlled VGA of claim 6, wherein the positive auxiliary amplifier is digitally controlled by one or more first auxiliary digital codes, and wherein the negative auxiliary amplifier is digitally controlled by one or more second auxiliary digital codes.

8. The digitally controlled VGA of claim 1, wherein a weight of the positive auxiliary amplifier or of the negative auxiliary amplifier is equal to a lowest weight of the at least two positive amplifiers of the positive amplification stage or a lowest weight of the at least two negative amplifiers of the corresponding negative amplification stage.

9. A method of forming a digitally controlled variable gain amplifier (VGA) to generate amplification output levels, the method comprising:
   providing a positive amplification stage comprising at least two positive amplifiers with positive weights;
   providing a corresponding negative amplification stage comprising at least two negative amplifiers with negative weights;
   coupling the corresponding negative amplification stage in parallel with the positive amplification stage, wherein an analog input of the digitally controlled VGA serves as an input for both the positive amplification stage and the corresponding negative amplification stage and an analog output of the digitally controlled VGA corresponds to an output of the positive amplification stage combined with an output of the corresponding negative amplification stage;
   providing a total amplification weight of the at least two negative amplifiers of the corresponding negative amplification stage equal to a total amplification weight of the at least two positive amplifiers of the positive amplification stage;
   controlling the positive amplification stage and the corresponding negative amplification stage by one or more digital codes;
   providing an auxiliary amplification stage coupled in parallel to the positive amplification stage and to the corresponding negative amplification stage, wherein the auxiliary amplification stage shares the analog input and the analog output of the positive amplification stage and the corresponding negative amplification stage, wherein the auxiliary amplification stage comprises a positive auxiliary amplifier with a positive weight and controlled by one or more first auxiliary digital code and/or a negative auxiliary amplifier with a negative weight and controlled by one or more second auxiliary digital codes; and allowing both the positive amplification stage and the corresponding negative amplification stage to selectively contribute to generation of the amplification output levels, thereby forming the digitally controlled VGA, wherein the auxiliary amplification stage further contributes to the generation of the amplification output levels for the digitally controlled VGA.

10. The method of claim 9, wherein the one or more digital codes comprise a control bit, and wherein the control bit is configured to control one or more of the at least two positive amplifiers of the positive amplification stage or one or more of the at least two negative amplifiers of the corresponding negative amplification stage.

11. The method of claim 9, wherein the one or more digital codes comprise one or more control bits, and wherein the positive amplification stage is controlled by the one or more control bits.

12. The method of claim 11, wherein the digitally controlled VGA further comprises an inverter circuit placed on the one or more digital codes towards the corresponding negative amplification stage, wherein the method further comprises generating one or more inverted control bits based on inverting the one or more control bits using the inverter circuit, and wherein the corresponding negative amplification stage is controlled by the one or more inverted control bits.

13. The method of claim 12, further comprising controlling individual positive amplifiers of the at least two positive amplifiers of the positive amplification stage with one of the one or more control bits, and controlling individual negative amplifiers of the at least two negative amplifiers of the corresponding negative amplification stage with one of the one or more inverted control bits, such that a positive amplifier of the at least two positive amplifiers and a negative amplifier of the at least two negative amplifiers having the same weight are controlled respectively by a control bit of the one or more control bits and a corresponding inverted control bit of the one or more inverted control bits.

14. The method of claim 9, wherein the auxiliary amplification stage comprises at least two auxiliary amplifiers, and wherein the at least two auxiliary amplifiers comprise a positive auxiliary amplifier and a negative auxiliary amplifier.

15. The method of claim 14, further comprising controlling the positive auxiliary amplifier by one or more first auxiliary digital codes, and controlling the negative auxiliary amplifier by one or more second auxiliary digital codes.

16. The method of claim 10, wherein a weight of the positive auxiliary amplifier or of the negative auxiliary amplifier is equal to a lowest weight of the at least two positive amplifiers of the positive amplification stage or a lowest weight of the at least two negative amplifiers of the corresponding negative amplification stage.

* * * * *

UNITED STATES PATENT AND TRADEMARK OFFICE
CERTIFICATE OF CORRECTION

PATENT NO. : 11,621,685 B2
APPLICATION NO. : 17/095658
DATED : April 4, 2023
INVENTOR(S) : Khaled Khalaf et al.

Page 1 of 1

It is certified that error appears in the above-identified patent and that said Letters Patent is hereby corrected as shown below:

In the Specification

In Column 9, Line 42-44, delete "FIG. 1E, and FIG. 1F demonstrate the behavior of the digitally controlled variable gain amplifier of FIG. 1B known from prior art and comprising dummy devices." and insert the same on Column 9, Line 41, as continuation of the same paragraph.

In the Claims

In Column 17, Line 30, In Claim 1, before "least" insert -- at --.

Signed and Sealed this
Eleventh Day of July, 2023

Katherine Kelly Vidal
*Director of the United States Patent and Trademark Office*